US010032847B2

(12) United States Patent
Jeon

(10) Patent No.: US 10,032,847 B2
(45) Date of Patent: Jul. 24, 2018

(54) DISPLAY DEVICE AND METHOD OF MANUFACTURING THE SAME

(71) Applicant: SAMSUNG DISPLAY CO., LTD., Yongin-si, Gyeonggi-Do (KR)

(72) Inventor: Heechul Jeon, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/470,277

(22) Filed: Mar. 27, 2017

(65) Prior Publication Data

US 2017/0278918 A1    Sep. 28, 2017

(30) Foreign Application Priority Data

Mar. 28, 2016  (KR) .................. 10-2016-0036973

(51) Int. Cl.
*H01L 29/04*    (2006.01)
*H01L 31/036*   (2006.01)
*H01L 27/32*    (2006.01)
*H01L 51/00*    (2006.01)
*H01L 27/12*    (2006.01)

(52) U.S. Cl.
CPC ........ *H01L 27/3276* (2013.01); *H01L 27/323* (2013.01); *H01L 27/3262* (2013.01); *H01L 51/0097* (2013.01); *H01L 27/1244* (2013.01); *H01L 2251/5338* (2013.01)

(58) Field of Classification Search
CPC ................. H01L 27/3276; H01L 51/0097

USPC ........................................... 257/72
See application file for complete search history.

(56) References Cited

U.S. PATENT DOCUMENTS

| 7,109,653 | B2 | 9/2006 | Imamura |
| 7,812,527 | B2 | 10/2010 | Kim et al. |
| 7,902,755 | B2 | 3/2011 | Kubota |
| 9,141,144 | B2 | 9/2015 | Kang et al. |
| 2013/0241855 | A1 | 9/2013 | Kim |
| 2014/0132553 | A1 | 5/2014 | Park et al. |
| 2018/0012551 | A1* | 1/2018 | Lee ............ G09G 3/3225 |
| 2018/0033821 | A1* | 2/2018 | Kim ............ H01L 27/14692 |

FOREIGN PATENT DOCUMENTS

| JP | 2008-311239 | 12/2008 |
| KR | 10-2004-0015360 | 2/2004 |
| KR | 10-2008-0056030 | 6/2008 |
| KR | 10-2013-0104300 | 9/2013 |
| KR | 10-2014-0062269 | 5/2014 |
| KR | 10-2014-0111884 | 9/2014 |
| KR | 10-2015-0057323 | 5/2015 |

* cited by examiner

*Primary Examiner* — David S Blum
(74) *Attorney, Agent, or Firm* — F. Chau & Associates, LLC

(57) ABSTRACT

A display device includes a substrate including a bending area, a display area. A plurality of first wires is disposed above the substrate. A second wire is disposed above the plurality of first wires. A third wire is disposed above the second wire. At least a portion of the second wire and at least a portion of the third wire are disposed in the bending area.

15 Claims, 5 Drawing Sheets

DISPLAY DEVICE AND METHOD OF MANUFACTURING THE SAME

CROSS-REFERENCE TO RELATED APPLICATION

This application claims priority under 35 U.S.C. § 119 to Korean Patent Application No. 10-2016-0036973, filed on Mar. 28, 2016, in the Korean Intellectual Property Office, the disclosure of which is incorporated by reference herein in its entirety.

TECHNICAL FIELD

Exemplary embodiments of the present invention relate to a display device and a method of manufacturing the display device.

DISCUSSION OF THE RELATED ART

The use of display devices is widespread. Display devices may include flat panel displays (FPDs) such as liquid crystal displays (LCDs), organic light-emitting diode (OLED) displays, plasma display panels (PDPs), etc.

Recently, a demand for flexible display panels has increased. Flexible display panels may be bendable in various directions. To apply a touch function to the flexible display panel, a bendable touch film may be needed.

However, cracks may occur in a wire disposed in a bending portion of the flexible display panel.

SUMMARY

According to an exemplary embodiment of the present invention, a display device includes a substrate including a bending area and a display area. A plurality of first wires is disposed above the substrate. A second wire is disposed above the plurality of first wires. A third wire is disposed above the second wire. At least a portion of the second wire and at least a portion of the third wire are disposed in the bending area.

According to an exemplary embodiment of the present invention, a method of manufacturing a display device includes providing a substrate including a bending area and a display area. A first wire is formed above the substrate. A second wire is formed above the first wire, the second wire being at least partially disposed in the bending area. A light emitting diode (LED) and an encapsulation unit are formed above the second wire. The encapsulating unit encapsulates the LED. A third wire is formed above the encapsulation unit.

BRIEF DESCRIPTION OF THE DRAWINGS

The above and other aspects and features of the present invention will become more apparent by describing in detail exemplary embodiments thereof in conjunction with the accompanying drawings, in which.

DETAILED DESCRIPTION OF THE EMBODIMENTS

Figure 1:
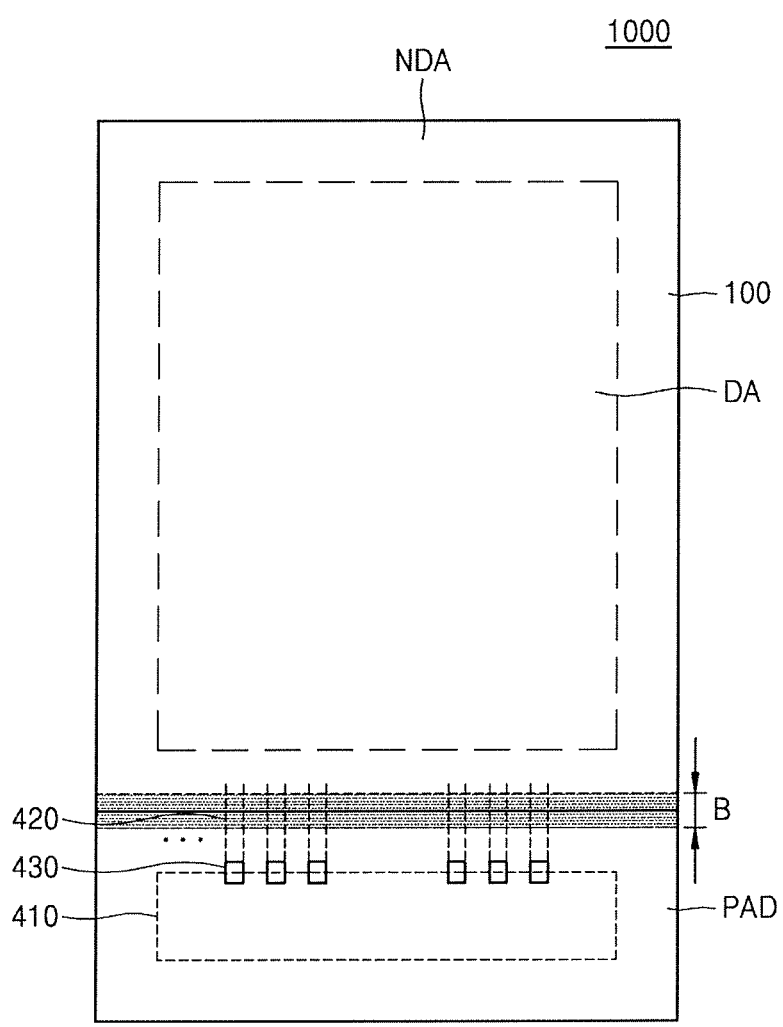
FIG. 1 is a plan view of a display device, according to an exemplary embodiment of the present invention.

Exemplary embodiments of the present invention will now be described more fully with reference to the accompanying drawings. Like reference numerals may refer to like elements throughout the specification. As used herein, the term "and/or" may include any and all combinations of one or more of the associated listed items.

The present invention is not limited to the exemplary embodiments thereof described herein. It will be understood that various changes in form and details may be made to the disclosed exemplary embodiments without departing from the spirit and scope of the present invention.

As used herein, the singular forms "a," "an" and "the" may be intended to include the plural forms as well, unless the context clearly indicates otherwise.

In the following description, when a layer is described as being disposed "on" or "above" another layer, the layer may be disposed directly on the other layer or intervening layers or elements may be interposed therebetween.

In the drawings, the thickness or size of each layer may be exaggerated for convenience of description and clarity.

When an exemplary embodiment of the present invention may be implemented in more than one way, a process order may be performed differently from an already-described process order. For example, two consecutively described processes may be performed substantially at the same time or performed in an order opposite to the described order.

FIG. 1 is a plan view of a display device 1000, according to an exemplary embodiment of the present invention.

The display device 1000, according to an exemplary embodiment of the present invention, may include a display area DA and a bending area B.

A substrate 100 of the display device 1000 may include various materials. For example, the substrate 100 may include a transparent glass material including $SiO^2$. However, the materials included in the substrate 100 are not limited thereto. For example, the substrate 100 may include a transparent plastic material. The transparent plastic material may be an organic material selected from a group consisting of polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP), which are insulating organic materials.

In a bottom emission-type display device, in which an image is displayed through the substrate 100, the substrate 100 needs to include a transparent material. However, in a top emission-type display device, in which an image is displayed in a direction away from the substrate 100, the substrate 100 does not need to include a transparent material. In this case, the substrate 100 may include a metal. When the substrate 100 includes a metal, the substrate 100 may include one or more metals selected from a group consisting of steel, chromium, manganese, nickel, titanium, molybdenum, stainless steel (SUS), an invar alloy, an Inconel alloy, and a Kovar alloy, but it is not limited thereto.

The substrate 100 may include the display area DA, in which an image recognizable by a user is generated, and a non-display area NDA, which is an edge area of the display area DA. An image might not be generated in the non-display area NDA.

Various devices that generate light, such as an organic light-emitting device, a liquid crystal display device, etc., may be included in the display area DA. A voltage line that supplies power to the various devices that generate light may be disposed in the non-display area NDA.

A pad unit PAD, that transfers an electrical signal to a power supply device or a signal generation device, may be disposed in the non-display area NDA.

The pad unit PAD may include a driver integrated circuit (IC) 410, a pad 430 that connects the driver IC 410 with a pixel circuit, and fan out wires 420.

Figure 6:
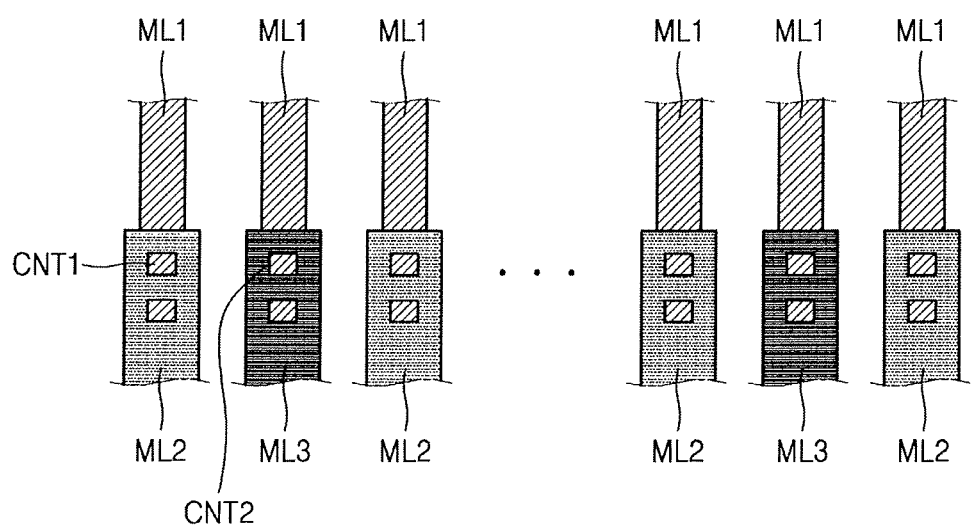
FIG. 6 is a plan view illustrating the bending area of a display device, according to an exemplary embodiment of the present invention.
Figure 8:
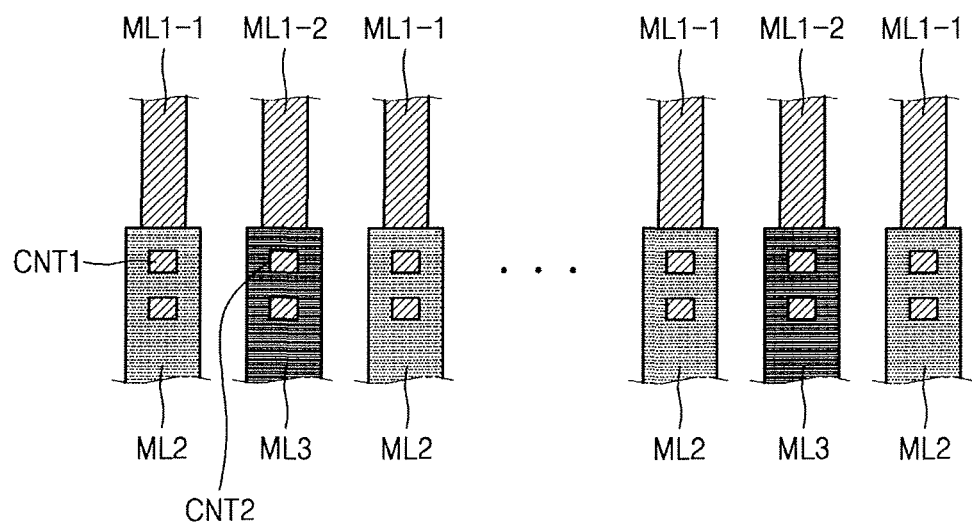
FIG. 8 is a plan view illustrating of the bending area of FIG. 7, according to an exemplary embodiment of the present invention.

According to an embodiment, the fan out wires 420 may include a first wire ML1, a second wire ML2 and/or a third wire ML3 (see FIGS. 6 and 8). A thin film transistor (TFT) (see FIG. 3) and the driver IC 410 are electrically connected to each other via the fan out wires 420. In other words, the fan out wires 420 are electrically connected to the thin film transistor in the display area DA and the driver IC 410 in the non-display area NDA.

Referring to the FIGS. 6 and 8, the first wire ML1 may be electrically connected to the TFT and at least one of the second wire ML2 and the third wire ML3 may be electrically connected to the driver IC 410. Thus, the TFT and the driver IC 410 are electrically connected to each other via the first wire ML1 and the at least one of the second wire ML2 and the third wire ML3.

The driver IC 410 may include a data driver for supplying a data signal to pixels included in the display area DA. The pixels may be electrically connected to the pixel circuit. In addition, the driver IC 410 may include various hardware components for driving the pixel circuit. The driver IC 410 may be mounted in the substrate 100 as a chip on glass (COG) type. The driver IC 410 may include a connection terminal that is electrically connected to the pad 430. The pad 430 may be formed, for example, at a side of the substrate 100. A conductive ball may be disposed between the pad 430 and the connection terminal to electrically connect and/or to bond the pad 430 with the connection terminal. The conductive ball may include an electrically conductive adhesive material that may electrically connect the pad 430 with the connection terminal and adhere the pad 430 to the connection terminal. The adhesive material of the conductive ball may include, for example, an anisotropic conductive film, a self organizing conductive film, etc.

The pad 430 may be formed over the substrate 100. The connection terminal of the driver IC 410 is electrically connected with the pad 430. The pad 430 may be electrically connected to the fan out wires 420. As shown in FIG. 1, the pad 430 may be disposed on a different layer from the fan out wires 420. However, the present invention is not limited thereto. For example, the pad 430 may be disposed on the same layer as the fan out wires 420. It is understood that the pad 430 electrically connects the driver IC 410 with the fan out wires 420. The pad 430 may include at least one selected from a group consisting of molybdenum (Mo), aluminum (Al), copper (Cu), silver (Ag), and titanium (Ti) in a single layer structure or in a multi-layer structure.

The fan out wires 420 may connect the pad 430 with the pixel circuit. The fan out wires 420 may include the same material as a gate electrode G (see FIG. 3) or a drain electrode D (see FIG. 3). In addition the fan out wires 420 may be formed on the same layer as the gate electrode G or a drain electrode D.

The substrate 100 of the display device 1000, according to an exemplary embodiment of the present invention, may be flexible and may elongate two-dimensionally.

The substrate 100 may include a material having a Poission's ratio of about 0.4 or more. The Poisson's ratio is a ratio of a length of a material that is stretched in a first direction and is contracted in a second direction perpendicular to the first direction.

The material forming the substrate 100 may have a Poisson's ratio of about 0.4 or more. In other words, the substrate 100 may stretch well and may be flexible. Since the substrate 100 may be stretchable and flexible, the display device 1000 may be bent or folded.

As an alternative, the substrate 100 may include the bending area B. The bending area B is bendable and/or foldable. For example, the display device 1000 may be bent or folded at the bending area B.

In FIG. 1 the bending area B is shown to be disposed in the non-display area NDA. However, the present invention is not limited thereto, and the bending area B may be formed at any region of the substrate 100.

The bending area B may also be disposed in the display area DA.

One bending area B is shown in the display device 1000 of FIG. 1. However, the number of bending areas B that may be included in the display device 1000 is not limited to one. For example, two or more bending areas B may be formed in the substrate 100 of the display device 1000.

Figure 2:
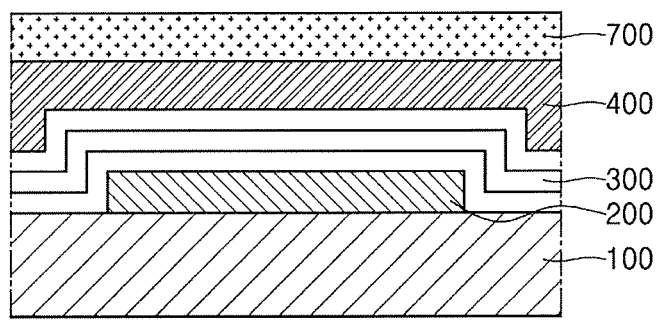
FIG. 2 is a cross-sectional view illustrating the display device of FIG. 1, according to an exemplary embodiment of the present invention.

FIG. 2 is a cross-sectional view illustrating the display device 1000 of FIG. 1, according to an exemplary embodiment of the present invention.

The display device 1000, according to an exemplary embodiment of the present invention, may include the substrate 100, a device unit 200, an encapsulation unit 300, a space layer 400, and a touch film 700.

The device unit 200 may be formed over the substrate 100. The device unit 200 may include various devices that generate light, such as an organic light-emitting device and a liquid crystal display device and a thin film transistor (TFT).

The display device 1000, according to an exemplary embodiment of the present invention, may include the encapsulation unit 300 to completely seal the device unit 200, to protect the device unit 200 from external moisture or oxygen.

As an alternative, the encapsulation unit 300 may be disposed above the device unit 200, and both ends of the encapsulation unit 300 may contact the substrate 100.

The encapsulation unit 300 may have a structure in which a plurality of thin film layers are stacked by alternately stacking inorganic layers and organic layers.

The inorganic layers may substantially prevent penetration of oxygen or moisture into the device unit 200. The organic layers may absorb stress from the inorganic layers to provide flexibility.

An inorganic layer may have a single layer structure or a multilayer structure. The single or multilayer structure of the inorganic layer may include a metal oxide or a metal nitride. In addition, the inorganic layer may include one of SiNx, $Al_2O_3$, $SiO_2$, and $TiO_2$.

The organic layer may include a polymer. The organic layer may have a single layer structure or a multilayer structure including, for example, one of PET, polyimide, PC, epoxy, polyethylene, and PAR. For example, in an exemplary embodiment of the present invention, the organic layer may include PAR. Further, the organic layers may include a polymerized monomer composition including diacrylate-based monomer and/or a triacrylate-based monomer. The monomer composition may further include a monoacrylate-based monomer. The monomer composition may further include a photoinitiator, such as TPO, but the present invention is not limited thereto.

The touch film 700 may be provided above the encapsulation layer 300, and the space layer 400 may be formed between the encapsulation layer 300 and the touch film 700.

The space layer 400 may be an organic layer.

The device unit 200 may include a light-emitting device, such as an organic light emitting diode (OLED). The light-emitting device may include an electrode, as described below. A parasitic capacitance may be generated between the electrode included in the device unit 200 and the touch film 700 disposed above the device unit 200. As a result, sensing sensitivity of the display device 1000 may be low.

A parasitic capacitance generated between two layers is inversely proportional to a distance between the two layers. To reduce the parasitic capacitance between the device unit 200 and the touch film 700, a constant distance between the device unit 200 and the touch film 700 may be required.

To maintain a constant distance between the device unit 200 and the touch film 700, the space layer 400 may be provided. The space layer 400 may have a varying thickness, as shown in FIG. 2. The space layer 400 may be an organic layer.

The space layer 400 may have a single layer structure or a multilayer structure, including an organic material. The space layer 400 may be formed through various deposition methods. For example, the space layer 400 may include one or more materials such as polyacrylate resin, epoxy resin, phenolic resin, polyamide resin, polyimide resin, unsaturated polyester resins, polyphenylene ether resin, poly phenylenesulfide resin, and benzocyclobutene (BCB).

The touch film 700 may be disposed above the device unit 200. The touch film 700 may detect a touch if an object approaches or contacts the touch film 700. Contact includes not only a case in which an external object, for example, a user's finger, directly contacts the touch film 700, but also a case in which the object approaches the touch film 700 or hovers over the touch film 700.

A structure of the touch film 700 will be described in detail later with the accompanying drawings.

Figure 3:
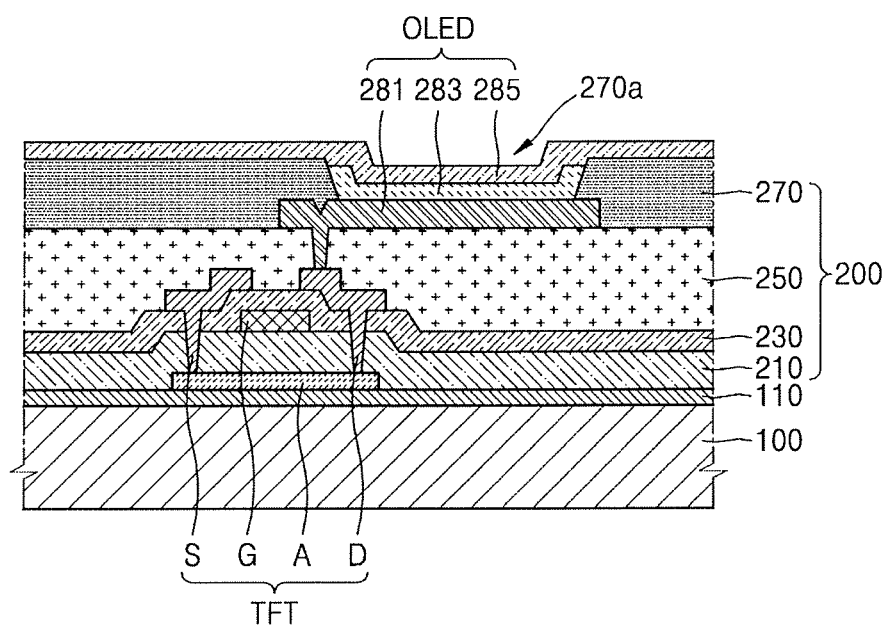
FIG. 3 is a cross-sectional view illustrating a portion of a display area of FIG. 1, according to an exemplary embodiment of the present invention.

FIG. 3 is a cross-sectional view illustrating a portion of the display area DA of FIG. 1, according to an exemplary embodiment of the present invention.

As described above, various devices that generate light, for example, an organic light-emitting device, a liquid crystal display device, etc., and a TFT, may be provided in the display area DA.

The present invention is not limited to a case in which the display area DA includes an OLED. However, for convenience of description, a case where the display area DA includes an OLED will be described below.

A buffer layer 110 may be formed over the substrate 100. The buffer layer 110 may provide a planar surface to the substrate 100 and may prevent impurities or moisture from penetrating through the substrate 100. The buffer layer 110 may contain, for example, an organic material such as silicon oxide, silicon nitride, silicon oxynitride, aluminum oxide, aluminum nitride, titanium oxide, or titanium nitride, or an organic material such as polyimide, polyester, or acrylic, and may have a multilayer structure including a plurality of the above materials. The buffer layer 110 may be formed above (e.g., on) the display area DA, and may extend in the non-display area NDA.

The TFT may include an active layer A, a gate electrode G, a source electrode S, and a drain electrode D.

The TFT is illustrated as a top gate-type TFT in which the active layer A, the gate electrode G, the source electrode S, and the drain electrode D are sequentially formed on the substrate 100 in the stated order. However, the present invention is not limited thereto. Various types of TFTs, such as a bottom gate-type TFT, may be employed.

The active layer A may include polysilicon. The active layer A may include a channel area that is not doped with impurities and a source area and a drain area that are formed at both sides of the channel area, the source and drain areas being are doped with impurities. The impurities may differ depending on the type of TFT and may be, for example, N type impurities or P type impurities.

After the active layer A is formed, a gate insulating layer 210 may be formed above the active layer A and above the entire surface of the substrate 100. The gate insulating layer 210 may have a single layer structure or a multilayer structure including layers including an inorganic material such as silicon oxide or silicon nitride. The gate insulating layer 210 may insulate the active layer A from the gate electrode G above the active layer A. The gate insulating layer G may not only extend in the display area DA, but also in a portion of the non-display area NDA.

After the gate insulating layer 210 is formed on the substrate 100, the gate electrode G may be formed above the gate insulating layer 210. The gate electrode G may be formed by photolithography and etching.

The gate electrode G may be formed above the gate insulating layer 210. A first wire ML1 (see FIG. 6) is disposed on a same layer with the gate electrode G. In an embodiment, the gate electrode G may be connected to a first wire ML1 that applies an on/off signal to the TFT.

The gate electrode G may include a low resistance metal material. The gate electrode G may have a single layer structure or a multilayer structure. The gate electrode G may include one or more materials such as, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), by taking into account adhesion with adjacent layers, surface planarization of stacked layers, processing, etc.

After the gate electrode G is formed, an interlayer insulating layer 230 may be formed over the entire surface of the substrate 100. The interlayer insulating layer 230 may insulate the source electrode S and the drain electrode D from each other. The interlayer insulating layer 230 may not only extend in the display area DA, but also in a portion of the non-display area NDA.

The interlayer insulating layer 230 may include an inorganic material. The interlayer insulating layer 230 may include a metal oxide or a metal nitride. For example, the inorganic material may include silicon oxide $SiO_2$, silicon nitride SiNx, silicon oxynitride SiON, aluminum oxide $Al_2O_3$, titanium oxide $TiO_2$, tantalum oxide $Ta_2O_5$, hafnium oxide $HfO_2$, or zinc oxide $ZrO_2$.

The interlayer insulating layer 230 may have a multilayer structure or a single layer structure. The interlayer insulating layer 230 may include an inorganic material such as silicon oxide SiOx and/or silicon nitride SiNx. In an exemplary embodiment of the present invention, the interlayer insulating layer 230 may have a dual structure of SiOx/SiNy or SiNx/SiOy.

The source electrode S and the drain electrode D of the TFT may be disposed above the interlayer insulating layer 230. A second wire ML2 (see FIG. 6) is disposed on a same layer with the source electrode S and the drain electrode D.

The source electrode S and the drain electrode D may have a single layer structure or a multilayer structure. Each of the source electrode S and the drain electrode D may include one or more materials such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode S and the drain electrode D may be formed to contact an area of the active layer A.

A via layer 250 may be formed above the entire surface of the substrate 100 and may cover the source electrode S and the drain electrode D. The via layer 250 may compensate for a height difference caused by the TFT, and may planarize an upper surface of the display area DA. In addition, the via layer 250 may prevent a defect from occurring in an OLED due to varying heights of elements disposed between the substrate 100 and the via layer 250.

The via layer 250 may include an insulating material. The via layer 250 may have a single layer structure or a multilayer structure. The via layer 250 may including an inorganic material, an organic material, or an organic/inorganic compound, and may be formed through various deposition methods. In an exemplary embodiment of the present invention, the via layer 250 may include one or more materials such as polyacrylate resin, epoxy resin, phenolic resin, polyamide resin, polyimide resin, unsaturated polyester resins, poly phenylene ether resins, poly phenylenesulfide resin, and BCB.

The OLED may be formed above the via layer 250. The OLED may include a first electrode 281, an intermediate layer 283 including an organic emission layer, and a second electrode 285. As shown in FIG. 3, the first electrode 281 may be electrically connected to the drain electrode D.

The first electrode 281 and/or the second electrode 285 may include a transparent electrode or a reflective electrode. When the first electrode 281 and/or the second electrode 285 includes a transparent electrode, the first electrode 281 and/or the second electrode 285 may include indium tin oxide (ITO), indium zinc oxide (IZO), zinc oxide ZnO, or indium oxide $In_2O_3$. When the first electrode 281 and/or the second electrode 285 includes a reflective electrode, the first electrode 281 and/or the second electrode 285 may include a reflective layer including Ag, Mg, Al, Pt, Pd, Au, Ni, Nd, Ir, Cr, or a compound thereof, and a transparent layer including ITO, IZO, ZnO, or $In_2O_3$. In an exemplary embodiment of the present invention, the pixel electrode 281 or the second electrode 285 may have an ITO/Ag/ITO structure.

The first electrode 281 may be formed over the via layer 250 and may be electrically connected to the TFT through a contact hole formed in the via layer 250. The first electrode 281 may be, for example, a reflective electrode. For example, the first electrode 281 may include a reflective layer including Ag, Mg, Al, Pt, Pd, Au, Ni, Nd, Ir, Cr, and a compound thereof, and a transparent or translucent electrode layer over the reflective layer. The transparent or translucent electrode layer may include one or more materials selected from a group consisting of ITO, IZO, zinc oxide (ZnO), indium oxide $In_2O_3$, indium gallium oxide (IGO), and aluminum zinc oxide (AZO).

The second electrode 285, disposed to face the first electrode 281, may be a transparent or translucent electrode. The second electrode 285 may include a metal thin layer having a low work function and including Li, Ca, LiF/Ca, LiF/Al, Al, Ag, Mg, and/or a compound thereof. An auxiliary electrode layer or a bus electrode, including a transparent electrode material such as ITO, IZO, ZnO, or $In_2O_3$, may be further formed over the metal thin layer. Accordingly, the second electrode 285 may transmit light emitted from the organic emission layer included in the intermediate layer 283. In other words, the light emitted from the organic emission layer may be reflected directly or by the first electrode 281 including the reflective electrode and may be discharged toward the second electrode 285.

However, the display area DA is not limited to a top emission type. The display device 1000 may be a bottom emission type in which, in the display area DA, the light emitted from the organic emission layer is discharged toward the substrate 100. In this case, the first electrode 281 may include a transparent or translucent electrode, and the second electrode 285 may include a reflective electrode. The display area DA of the display device 1000 may also be a dual emission type display area, in which light is emitted from both the top and bottom sides of the display area DA.

A pixel defining layer 270, defining a pixel area and a non-pixel area, may be formed on the substrate 100. The pixel defining layer 270 may include an opening 270a, exposing the first electrode 281. The pixel defining layer 270 may be formed to cover the entire surface of the substrate 100.

The pixel defining layer 270 may include one or more organic insulating materials selected from a group consisting of polyimide, polyamide, acrylic resin, benzocyclobutene, and phenol resin. The pixel defining layer 270 may be formed through a method such as spin coating.

Figure 4:
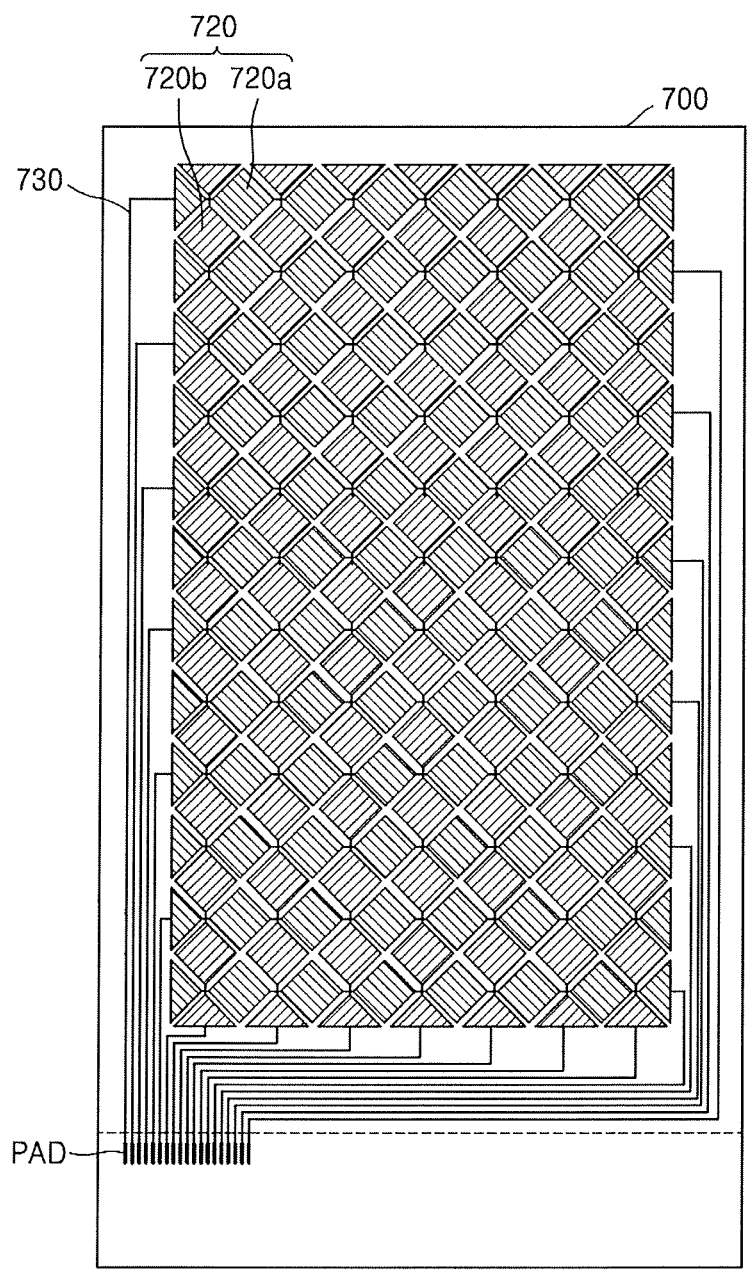
FIG. 4 is a plan view illustrating a touch film included in a display device, according to an exemplary embodiment of the present invention.
Figure 5:
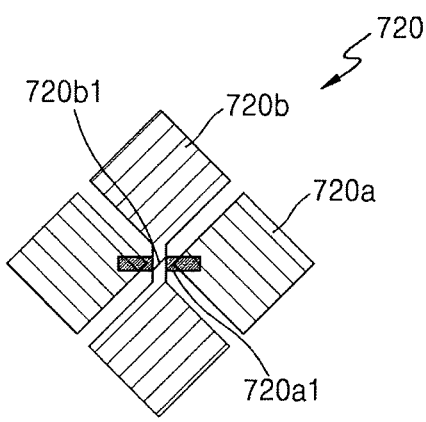
FIG. 5 is an enlarged view of a portion of a touch pattern included in the touch film of FIG. 4, according to an exemplary embodiment of the present invention.

FIG. 4 is a plan view illustrating the touch film 700 included in the display device 1000, according to an exemplary embodiment of the present invention. FIG. 5 is an enlarged view of a portion of a touch pattern 720 included in the touch film 700 of FIG. 4, according to an exemplary embodiment of the present invention.

The touch film 700 may include a base film and a plurality of touch patterns 720 formed over the base film.

As shown in FIG. 4, the touch patterns 720 may include a plurality of first touch cells 720a and a plurality of second touch cells 720b.

The first touch cells 720a and the second touch cells 720b may include a transparent conductive material such as ITO.

Each of the plurality of touch patterns 720 may be electrically connected to touch wires 730. The plurality of touch patterns 720 may be connected to the pad unit PAD and an external driving circuit through the touch wires 730.

The touch wires 730 may be disposed in the display area DA, (see FIG. 1) on which an image is displayed, and the non-display area NDA, (see FIG. 1) that is an edge portion of the display area DA. The touch wires 730 may include one or more materials. For example, the touch wires 730 may include a low resistance metal material such as molybdenum (Mo), silver (Ag), titanium (Ti), copper (Cu), aluminum (Al), molybdenum/aluminum/molybdenum Mo/Al/Mo, etc., in addition to the transparent conductive material used to form the touch patterns 720.

The touch film 700, according to an exemplary embodiment of the present invention, may be a capacitance type touch panel. In a capacitance type touch panel, when an object such as a user's finger or a stylus pen contacts the touch film 700, the object may cause a capacitance change. The capacitance change may be transmitted to a driving circuit of the display device 1000 through the touch wires 730 and the pad unit PAD. The capacitance change is related to the location of the touch film 700 contacted by the object. Accordingly, the capacitance change originates from the location of the touch patterns 720 (e.g., the particular first touch cells 720a and the second touch cells 720b) touched by the object.

Then, the capacitance change may be converted into an electrical signal by an X and Y input processing circuit. Thus, the contact location (e.g., the particular first touch cells 720a and the second touch cells 720b) touched by the object may be identified.

Referring to FIG. 5, the touch film 700 may include the plurality of first touch cells 720a, formed to be connected in a row direction for each row of the touch patterns 720, and a plurality of first connection lines 720a1, that connect the first touch cells 720a in the row direction.

The touch film 700 may also include the plurality of second touch cells 720b, formed to be connected in a column direction for each column of the touch patterns 720, and a plurality of second connection lines 720b1, that connect the second touch cells 720b in the column direction.

Although only a portion of the film 700 is illustrated in FIG. 5 for convenience of description, it is understood that the touch film 700 may include a plurality of touch patterns 720 repeatedly arranged in the row and column directions, as shown in FIG. 4.

The first touch cells 720a and the second touch cells 720b may be alternately arranged to not overlap each other. The first connection lines 720a1 and the second connection lines 720b1 may cross each other.

In addition, an insulating layer for achieving stability of the touch patterns 720 may be disposed between the first connection lines 720a1 and the second connection lines 720b1.

Alternatively, the first touch cells 720a and the second touch cells 720b may be integrally formed with the first connection lines 720a1 and the second connection lines 720b1, respectively, by using a transparent conductive material such as ITO, or may be separately formed from and electrically connected to the first connection lines 720a1 and the second connection lines 720b1.

For example, the second touch cells 720b may be patterned in a column direction and be integrally formed with the second connection lines 720b1. In this case, the first touch cells 720a may be patterned to be independent patterns between the second touch cells 720b, and may be connected via the first connection lines 720a1 above or below the first touch cells 720a in a row direction.

The first connection lines 720a1 may directly contact and may be electrically connected to the first touch cells 720a above or below the first touch cells 720a, or may be electrically connected to the first touch cells 720a via a contact hole, etc.

The first connection lines 720a1 may include a transparent conductive material such as ITO, or an opaque low resistance metal material. The widths of the transparent conductive material and/or the opaque low resistance metal material may be adjusted to prevent patterns from being viewed by a user of the display device 1000.

FIG. 6 is a plan view illustrating of the bending area B of a display device, according to an exemplary embodiment of the present invention. The same reference numerals denote the same elements between FIG. 6 and FIGS. 1 through 5. Duplicative descriptions of elements that have already been described may be omitted for brevity.

The display device of FIG. 6 may include the substrate 100 including the bending area B, the first wire ML1, the second wire ML2, and a third wire ML3 disposed on the substrate 100.

FIG. 6 is a plan view illustrating the bending area B of FIG. 1, according to an exemplary embodiment of the present invention. The second wire ML2 and the third wire ML3 may be formed on the substrate 100 (see FIG. 1) in the bending area B. It is understood that in FIG. 6, each second wire ML2 and each third wire ML3 are connected to different first wires ML1.

Alternatively, at least a portion of the first wire ML1 may be disposed in the bending area B. The second wire ML2 and the third wire ML3 may be formed above the first wire ML1.

Alternatively, the first wire ML1 may be formed over the substrate 100 in an area adjacent to the bending area B, but not in the bending area B.

The area adjacent to the bending area B means an area beside or adjacent to the bending area B, among areas of the substrate 100, other than the bending area B. The area adjacent to the bending area B may include any area of the substrate 100, except for the bending area B.

The first wire ML1, the second wire ML2, and the third wire ML3 may be sequentially formed in the area of the substrate 100 other than the bending area B. According to an exemplary embodiment of the present invention, the first wire ML1 may not be formed in the bending area B, and at least a portion of the second wire ML2 and at least a portion of the third wire ML3 may be formed in the bending area B.

In the display device 1000, according to an exemplary embodiment of the present invention, no cracks may occur in the first wire ML1, even if the bending area B is repeatedly folded and unfolded, since the first wire ML1 is not formed on the bending area B. However, the second wire ML2 and the third wire ML3 may be formed in the bending area B.

The first wire ML1 and the second wire ML2 may respectively be disposed on the same layer with the gate electrode G (see FIG. 3) and the source/drain electrode S and D (see FIG. 3). The third wire ML3 and the touch wires 730 (see FIG. 4) may include a same material. However, exemplary embodiments of the present invention are not limited thereto.

Alternatively, the TFT (FIG. 3) may further include an upper drain electrode in addition to the drain electrode D. The upper drain electrode may be disposed over the drain electrode D. The second wire ML2 and the third wire ML2 may be disposed on a same layer with the drain electrode D and the upper drain electrode, respectively.

Alternatively, the third wire ML3 may be disposed on a same layer with a first electrode.

The first wire ML1 may include one or more materials such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), which are metals having low flexibility.

The bending area B of the substrate 100 of the display device 1000, according to an exemplary embodiment of the present invention, may be repeatedly folded and unfolded, or bent and straightened. During the process of folding and unfolding, or bending and straightening the bending area B of the substrate 100, when the first wire ML1, is formed in an area of the substrate 100 other than the bending area B, no cracks occur may occur in the first wire ML1 since the first wire ML1 is not being folded and unfolded, or bent and straightened in the bending area B.

The second wire ML2 and the third wire ML3 may be disposed at different heights with respect to the substrate 100. For example, the third wire ML3 may be disposed above the second wire ML2.

The second wire ML2 and the third wire ML3 may be disposed at different heights from the substrate 100, and thus a short circuit may not occur therebetween, although horizontal spaces (e.g., a horizontal distance between the second wire ML2 and the third wire ML3, the horizontal distance being measured in a direction parallel to the surface of the substrate 100 that faces the second and third wire ML2 and ML3) between the second and third wires ML2 and ML3 are not constant. For example, the second wire ML2 and the third wire ML3 may be formed without maintaining a constant horizontal space therebetween. Thus, since the second wire ML2 may be disposed on a different layer from the third wire ML3, the second wire ML2 and the third wire ML3 need not maintain a constant horizontal distance therebetween to avoid short circuiting on the same layer. Thus, a dead space generated by the second wire ML2 and the third wire ML3 may be reduced.

The interlayer insulating layer 230 (see FIG. 7) may be formed between the first wire ML1 and the second wire ML2. However, this arrangement is merely an example. Other insulating layers may also be formed between the first wire ML1 and the second wire ML2.

The encapsulation unit 300 (see FIG. 7) may be formed between the second wire ML2 and the third wire ML3. For example, the third wire ML3 may be formed above the encapsulation unit 300. However, this is merely an example. Other insulating layers including the encapsulation unit 300 may also be formed between the second wire ML2 and the third wire ML3.

As shown in FIG. 6, a plurality of the first wires ML1, a plurality of the second wires ML2 and a plurality of third wires ML3 may be provided on the substrate 100. The second wires ML2 and the third wires ML3 may be arranged side by side, and may be alternately formed. One of the plurality of first wires ML1 and the second wire ML2 are connected to each other and other of the plurality of first wired and the third wire are connected to each other.

The plurality of second wires ML2 and a plurality of third wires ML3 may be disposed at different heights from the substrate 100. For example, the plurality of third wires ML3 may be disposed to have a greater perpendicular distance from the substrate 100 than the plurality of second wires ML2.

Thus, even if the second wires ML2 and the third wires ML3, that have different heights from the substrate 100, are alternately disposed without maintaining constant horizontal spaces therebetween, no short circuit occurs between the second wires ML2 and the third wires ML3. For example, the second wires ML2 and the third wires ML3 may be formed without maintaining a constant horizontal space therebetween. Since the second wires ML2 may be disposed on a different layer from the third wires ML3, the second wires ML2 and the third wires ML3 need not maintain a constant horizontal distance therebetween to avoid short circuiting on the same layer. Thus, no dead space is generated from the second wires ML2 and the third wires ML3.

A first contact hole CNT1 may be formed in the one of the plurality of first wires ML1, the second wire ML2 is connected to the one of the plurality of first wires ML1 through the first contact hole CNT1. A second contact hole CNT2 may be formed in the other of the plurality of first wires ML1, the third wire ML3 is connected to the other of the plurality of first wires ML2 through the second contact hole CNT2.

The second wire ML2 and the third wire ML3 may include same material. According to an embodiment, the second wire ML2 and the third wire ML3 may include a Ti/Al/Ti material, which has a low probability of cracking when bent. In other words, a Ti/Al/Ti material has a high resistivity to cracking from bending. When the second wire ML2 and the third wire ML3 include the Ti/Al/Ti material, although at least a portion of the second wire ML2 and at least a portion of the third wire ML3 is disposed in the bending area B and is repeatedly bent, the probability that the second and third wires ML2 and ML3 will crack is low.

However, the present invention is not limited thereto. For example, the second wire ML2 and the third wire ML3 may include a material that is resistant to cracking from bending and/or folding other than the Ti/Al/Ti material, and may include a combination of different materials that are resistant to cracking from bending and/or folding. According to an exemplary embodiment of the present invention, the Ti/Al/Ti material may include a structure including a layer including aluminum (Al) disposed between two other layers, each of the two other layers including titanium (Ti).

Figure 7:
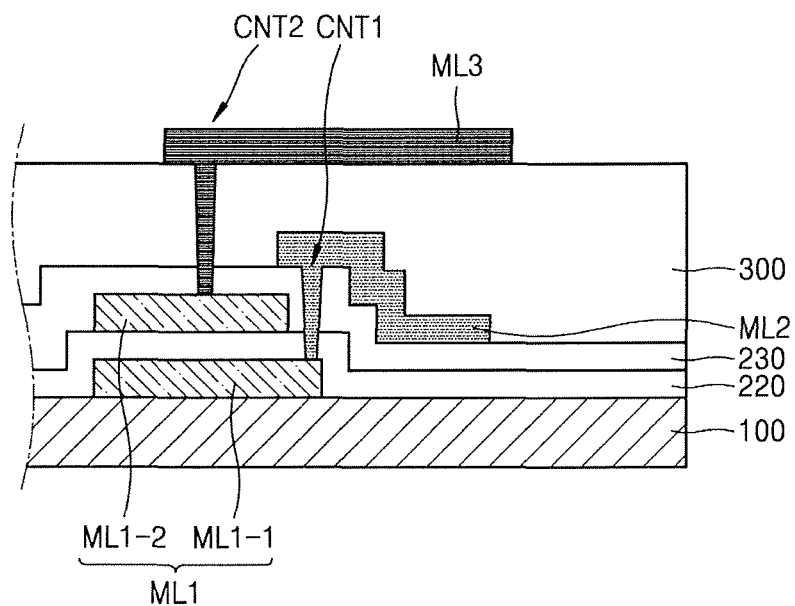
FIG. 7 is a cross-sectional view illustrating a bending area of a display device, according to an exemplary embodiment of the present invention.

FIG. 7 is a cross-sectional view illustrating the bending area B of a display device 1000, according to an exemplary embodiment of the present invention. FIG. 8 is a plan view illustrating the bending area B of FIG. 7, according to an exemplary embodiment of the present invention. The same reference numerals denote the same elements between FIGS. 7 and 8 and FIGS. 1 through 6. Duplicative descriptions of elements that have already been described may be omitted for brevity.

The display device 1000, according to an exemplary embodiment of the present invention, may include the substrate 100 including the bending area B, the first wire ML1, the second wire ML2, and the third wire ML3 disposed on the substrate 100.

Referring to FIGS. 7 and 8, the first wire ML1 may include a wire ML1-1 (e.g., a bottom wire) and a wire ML1-2 (e.g., a top wire). For example, the top wire ML1-2 may be formed above the bottom wire ML1-1. The second wire ML2 may be formed above the top wire ML1-2.

A first interlayer insulating layer 220 may be formed between the bottom wire ML1-1 and the top wire ML1-2 to insulate the wires ML1-1 and ML1-2 from each other.

Alternatively, the interlayer insulating layer 230 may be formed between the bottom wire ML1-1 and the top wire ML1-2 to insulate the wires ML1-1 and ML1-2 from each other.

The encapsulation unit 300 may be formed between the second wire ML2 and the third wire ML3. For example, the third wire ML3 may be formed above the encapsulation unit 300. However, this is merely an example. Other insulating layers, including the encapsulation unit 300, may also be formed between the second wire ML2 and the third wire ML3.

FIG. 7 is a cross-sectional view illustrating the bending area B of FIG. 1, according to an exemplary embodiment of the present invention. The second wire ML2 and the third wire ML3 may be formed over the substrate 100 in the bending area B.

At least a portion of the bottom wire ML1-1 and at least a portion the top wire ML1-2 may be disposed in the bending area B. The second wire ML2 and the third wire ML3 may be sequentially formed above the bottom wire ML1-1 and the top wire ML1-2, the wires ML1-1 and ML1-2 having at least a portion thereof disposed in the bending area B.

Alternatively, the bottom wire ML1-1 and the top wire ML1-2 may be formed over the substrate 100 in an area adjacent to the bending area B, other than in the bending area B. The second wire ML2 and the third wire ML3 may be formed in the bending area B.

For example, the bottom wire ML1-1 and the top wire ML1-2 may be formed first, and then the second wire ML2 and the third wire ML3 may be formed in the area adjacent the bending area B. In this case, the bottom wire ML1-1 and the top wire ML1-2 may not be formed in the bending area B, and the second wire ML2 and the third wire ML3 may be formed in the bending area B.

In the display device 1000, according to an exemplary embodiment of the present invention, no cracks may occur in the bottom wire ML1-1 and the top wire ML1-2 since the bottom wire ML1-1 and the top wire ML1-2 are not formed in the bending area B. The second wire ML2 and the third wire ML3 may be formed in the bending area B. In addition, since the second wire ML2 and the third wire ML3 may be formed of one or more materials having a flexible or bend-resistant structure, the second wire ML2 and the third wire ML3 may resist repetitive bending and straightening, or folding and unfolding experienced in the bending area B.

One of the bottom wire ML1-1 and the top wire ML1-2 may be disposed on a same layer with the gate electrode G (see FIG. 3).

The second wire ML2 may be disposed on a same layer with the source electrode S and the drain electrode D (see FIG. 4) and the third wire ML3 and the touch wires 730 (see FIG. 4) may include a same material, but are not limited thereto. The second wire ML2 and the third wire ML3 may be other wires provided over the substrate 100.

According to an exemplary embodiment of the present invention, the third wire ML3 may be formed on the same layer as a first electrode.

The bottom wire ML1-1, the top wire ML1-2, the second wire ML2, and the third wire ML3, respectively, may be disposed at increasing heights from the substrate 100 in a direction perpendicular to the substrate 100. For example, the top wire ML1-2 may be formed above the bottom wire ML1-1, the second wire ML2 may be formed above the top wire ML1-2, and the third wire ML3 may be formed above the second wire ML2.

At least a portion of the second wire ML2 and at least a portion of the third wire ML3, which are formed in the bending area B, may be disposed at different heights from the substrate 100. Thus, a short circuit may not occur therebetween, although a horizontal distance between the second wire ML2 and the third wire ML3 may not be constantly maintained over the substrate 100. For example, the second wires ML2 and the third wires ML3 may be formed without maintaining a constant horizontal space therebetween. Since the second wire ML2 may be disposed on a different layer from the third wire ML3, the second wire ML2 and the third wire ML3 need not maintain a constant horizontal distance therebetween to avoid short circuiting on the same layer. Since the second wire ML2 and the third wire ML3 may be formed without maintaining a constant horizontal distance therebetween, a dead space may be reduced.

The bottom wire ML1-1 and the top wire ML1-2 may not be formed in the bending area B. The bottom wire ML1-1 and the top wire ML1-2, which are disposed in the area adjacent to the bending area B, may be physically and electrically connected to the second wire ML2 and the third wire ML3, respectively.

As shown in FIG. 7, the first contact hole CNT1 and the second contact hole CNT2 may be formed in the area adjacent to the bending area B. It is understood that more than one first contact hole CNT1 may be formed on the bottom wire ML1-1, and that more than one second contact hole CNT2 may be formed on the top wire ML1-2.

The first contact hole CNT1 may expose the bottom wire ML1-1. The second contact hole CNT2 may expose the top wire ML1-2.

As shown in FIG. 7, the second wire ML2 may be connected to the bottom wire ML1-1 through the first contact hole CNT1, and the third wire ML3 may be connected to the top wire ML1-2 through the second contact hole CNT2. However, this is merely an example The second wire ML2 may be connected to the top wire ML1-2, and the third wire ML3 may be connected to the bottom wire ML1-1.

As shown in FIG. 8, two or more second wires ML2 and two or more third wires ML3 may be provided on the substrate 100.

As shown in FIGS. 6 and 8, the second wires ML2 and the third wires ML3 may be arranged side by side and may be alternately formed.

The plurality of second wires ML2 and third wires ML3 may be disposed at different heights from the substrate 100, as described above. For example, the plurality of third wires ML3 may be disposed to have a greater distance in a direction perpendicular to a plane or surface of the substrate 100, the plane or surface of the substrate 100 facing the third wires ML3 and the second wires ML2, than the plurality of second wires ML2. Accordingly, the plurality of third wires ML3 may be disposed further apart from the substrate 100 than the plurality of second wires ML2.

Thus, even if the second wires ML2 and the third wires ML3 are alternately disposed without maintaining constant horizontal spaces therebetween, no short occurs since the second wires ML2 and the third wires ML3 are disposed at different heights from the substrate 100. For example, the second wires ML2 and the third wires ML3 may be formed without maintaining a constant horizontal space therebetween. Since the second wire ML2 may be disposed on a different layer from the third wire ML3, the second wire ML2 and the third wire ML3 need not maintain a constant horizontal distance therebetween to avoid short circuiting on the same layer. Accordingly, no dead space is generated by the second wires ML2 and the third wires ML3.

The second wire ML2 and the third wire ML3 may include a Ti/Al/Ti material having a low probability of cracking due to bending and/or folding.

For example, when the wire ML2 and the third wire ML3 may include the Ti/Al/Ti material, and at least a portion of the wire ML2 and at least a portion of the third wire ML3 is disposed in the bending area B. Since the Ti/Al/Ti material included in the second wire ML2 and the third wire ML3 is resistant to cracking from bending and/or folding, the portion of the second wire ML2 and the third wire ML3 that is disposed and bent in the bending area B may resist cracking from repetitive bending and/or folding of the bending area B. However, the present invention is not limited thereto. For example, the second wire ML2 and the third wire ML3 may include a material that is resistant to cracking from bending and/or folding other than the Ti/Al/Ti material, and may include a combination of different materials that are resistant to cracking from bending and/or folding.

A method of manufacturing the display device 1000, according to an exemplary embodiment of the present invention, will now be described with reference to FIGS. 1, 2, 3, and 6. Duplicative descriptions of elements that have already been described may be omitted for brevity.

The substrate 100 may be formed or provided. The substrate 100 may include the bending area B and the display area DA. The substrate 100 may be flexible and may elongate two-dimensionally.

The display device 1000 may be temporarily bent or folded at the bending area B. The location of the bending area B on the substrate 100 may vary, and the number of bending areas B on the substrate 100 is not limited to one. For example, the substrate 100 may include a plurality of bending areas B. The bending area B may also be positioned in the display area DA. For example, the bending area B may be formed in any area of the substrate 100.

The first wire ML1 may be formed on the substrate 100.

The first wire ML1 may be a gate wire. A part of the first wire ML1 may form the gate electrode G in the display area DA.

At least a part of the first wire ML1 may be disposed in the bending area B.

For example, the first wire ML1 may be formed on the substrate 100 in an area other than the bending area B.

The interlayer insulating layer 230 may be formed above the first wire ML1.

The first contact hole CNT1 may be formed by removing a part of the interlayer insulating layer 230 adjacent to the bending area B through an etching process. For example, the etching process may include wet etching, dry etching, or another kind of etching which may combine wet etching and dry etching.

The second wire ML2 may be formed above the interlayer insulating layer 230. The second wire ML2 may be physically and/or electrically connected to the first wire ML1 via the first contact hole CNT1.

In addition, the second wire ML2 may be formed over all areas of the substrate 100. For example, the second wire ML2 may be formed in the bending area B.

The second wire ML2 may be a data wire. A part of the second wire ML2 may form the source electrode S and the drain electrode D in the display area DA.

An emission device and the encapsulation unit 300, which encapsulates the emission device, may be formed above the second wire ML2. The emission device may be an OLED, but it is not limited thereto. According to an exemplary embodiment of the present invention, whether the emission device is an OLED, a liquid crystal display (LCD) device, or the like, the emission device may emit light.

The encapsulation unit 300 may be formed as a thin, encapsulating type of film. The encapsulation unit 300 may include a plurality of thin organic layers and a plurality of thin inorganic layers alternately stacked on each other.

The second contact hole CNT2 may be formed by removing a part of an insulating layer, for example, by removing a part of the interlayer insulating layer 230 and the encapsulation unit 300, which are adjacent to the bending area B. The removal of the interlayer insulating layer 230 and the encapsulation unit 300 may be done through an etching process. The etching process may include wet etching, dry etching, or another kind of etching which combines combination wet etching and dry etching.

The touch film 700 may be formed above the encapsulation unit 300. The touch film 700 may include the plurality of touch patterns 720. The touch patterns 720 may be electrically connected to the touch wires 730. The touch patterns 720 may be connected to the pad unit PAD and to an external driving circuit through the touch wires 730.

The third wire ML3 may be formed above the encapsulation unit 300, and the third wire ML3 and the touch wire 730 may include a same material.

The third wire ML3 may be physically and/or electrically connected to the first wire ML1 through the second contact hole CNT2.

The third wire ML3 may be formed over all areas of the substrate 100. For example, the third wire ML3 may be formed in the bending area B.

A method of manufacturing the display device 1000, according to an exemplary embodiment of the present invention, will now be described with reference to FIGS. 1, 2, 3, and 7.

The substrate 100, including the bending area B and the display area DA, may be prepared (e.g., formed or provided).

The bottom wire ML1-1 may be formed above the substrate 100. The first interlayer insulating layer 220 may be formed above the bottom wire ML1-1.

At least a portion of the bottom wire ML1-1 may be disposed in the bending area B.

The bottom wire ML1-1 may be formed above the substrate 100, in an area other than the bending area B.

The top wire ML1-2 may be formed above the first interlayer insulating layer 220. The interlayer insulating layer 230 may be formed above the wire ML1-2.

At least a portion of the top wire ML1-2 may be disposed in the bending area B.

The top wire ML1-2 may be formed above the substrate 100 in an area other than the bending area B.

The first contact hole CNT1 may be formed by removing a portion of the first insulating layer 220 and the interlayer insulating layer 230 adjacent to the bending area B through an etching process.

The second wire ML2 may be formed above the interlayer insulating layer 230. The second wire ML2 may be physically and/or electrically connected to the first wire ML1 via the first contact hole CNT1.

At least a portion of the second wire ML2 may be formed in the bending area B.

An emission device, and the encapsulation unit 300 that encapsulates the emission device, may be formed above the second wire ML2. The second contact hole CNT2 may be formed by removing a portion of an insulating layer, including the interlayer insulating layer 230 and the encapsulation unit 300, that are adjacent to the bending area B.

The touch film 700 may be formed above the encapsulation unit 300. The touch film 700 formed above the encapsulation unit 300 may include the touch wires 730.

The third wire ML3 may be physically and/or electrically connected to the first wire ML1 through the second contact hole CNT2.

The third wire ML3 may be formed over all areas of the substrate 100. For example, the third wire ML3 may also be formed in the bending area B.

As described above, even if a wire space (e.g., a horizontal wire spacing) is reduced in a bending area B of the substrate 100, short circuiting of the wires may be prevented from occurring since the wires may be disposed on different layers.

As a result, a dead space of the bending area B may be reduced.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A display device, comprising:
   a substrate comprising a bending area and a display area;
   a plurality of first wires disposed above the substrate;
   a second wire disposed above the plurality of first wires; and
   a third wire disposed above the second wire,
   wherein at least a portion of the second wire and at least a portion of the third wire are disposed in the bending area.

2. The display device of claim 1, further comprising a plurality of second wires and a plurality of third wires,
   wherein the plurality of second wires and the plurality of third wires are alternately arranged with respect to each other in the bending area.

3. The display device of claim 1, wherein, in the bending area, the second wire and the third wire are disposed on different layers.

4. The display device of claim 3, wherein, in the bending area, a first distance from the substrate to the third wire is greater than a second distance from the substrate to the second wire, wherein the first distance is measured perpendicularly with respect to a first surface of the substrate, and the second distance is measured perpendicularly with respect to the first surface of the substrate.

5. The display device of claim 1, further comprising a thin film transistor (TFT) disposed in the display area,
   wherein the TFT comprises an active layer, a gate electrode, a source electrode and a drain electrode, and
   wherein the second wire is disposed on a same layer with the source electrode and the drain electrode.

6. The display device of claim 1, wherein a touch film is disposed on the substrate, the touch film comprising a touch pattern and a touch wire electrically connected to the touch pattern, and
   wherein the third wire and the touch wire comprise a same material.

7. The display device of claim 1, further comprising a thin film transistor (TFT) disposed in the display area,
   wherein the TFT comprises an active layer, a gate electrode, a source electrode and a drain electrode, and
   wherein the one of the plurality of first wires is disposed on a same layer with the gate electrode.

8. The display device of claim 7, wherein a first contact hole and a second contact hole are disposed in an area of the substrate adjacent to the bending area, the first contact hole exposing a portion of the one of the plurality of first wires, and the second contact hole exposing a portion of the other of the plurality of first wires,
   wherein the one of the plurality of first wires and the second wire are connected to each other through the first contact hole, and
   wherein the other of the plurality of first wires and the third wire are connected to each other through the second contact hole.

9. The display device of claim 1, wherein the one of the plurality of first wires comprises a bottom wire disposed over the substrate and a top wire disposed above the bottom wire in an area adjacent to the bending area.

10. The display device of claim 9, further comprising a thin film transistor (TFT) disposed in the display area,
    wherein the TFT comprises an active layer, a gate electrode, a source electrode and a drain electrode, and
    wherein one of the bottom wire and the top wire is disposed on a same layer with the gate electrode.

11. The display device of claim 10, wherein a first contact hole, through which a portion of the bottom wire is exposed, and a second contact hole, through which a portion of the top wire is exposed, are disposed in the area of the substrate adjacent to the bending area,
    wherein the bottom wire and the second wire are connected to each other through the first contact hole, and
    wherein the top wire and the third wire are connected to each other through the second contact hole.

12. The display device of claim 1, further comprising a light emitting diode (LED) disposed between the second wire and the third wire, wherein the LED emits light.

13. The display device of claim 12, further comprising an encapsulation unit disposed between the second wire and the third wire,
    wherein the encapsulation unit encapsulates the LED.

14. A display device, comprising:
    a substrate comprising a display area and a non display area;
    a thin film transistor (TFT) disposed in the display area;
    an integrated circuit (IC) disposed in the non display area;
    a first wire disposed above the substrate, the first wire electrically connected to the TFT;
    a second wire disposed above the first wire; and
    a third wire disposed above the second wire,
    wherein the first wire is electrically connected to at least one of the second wire and the third wire, and
    wherein the at least one of the second wire and the third wire is electrically connected to the IC.

15. The display device of claim 14,
    wherein the first wire comprises a bottom wire disposed over the substrate and a top wire disposed above the bottom wire,
    wherein one of the bottom wire and the top wire is connected to the second wire, and the other of the bottom wire and the top wire is connected to the third wire, and
    wherein the second wire and the third wire comprise a same material.

* * * * *